United States Patent [19]
Yamaguchi

[11] Patent Number: 5,398,205
[45] Date of Patent: Mar. 14, 1995

[54] SEMICONDUCTOR MEMORY DEVICE HAVING TRENCH IN WHICH WORD LINE IS BURIED

[75] Inventor: Shinsuke Yamaguchi, Tokyo, Japan

[73] Assignee: NEC Corporation, Tokyo, Japan

[21] Appl. No.: 239,555

[22] Filed: May 9, 1994

[30] Foreign Application Priority Data

May 10, 1993 [JP] Japan .................................. 5-107852

[51] Int. Cl.⁶ ........................ G11C 11/34; H01L 29/68
[52] U.S. Cl. ...................................... 365/185; 365/149; 257/301; 257/306; 257/309
[58] Field of Search ...................... 365/185, 149, 102; 257/296, 300, 301, 303, 306, 309, 622

[56] References Cited

U.S. PATENT DOCUMENTS

| | | | |
|---|---|---|---|
| 4,796,228 | 1/1989 | Baglee | 365/185 |
| 4,979,004 | 12/1990 | Esquivel et al. | 365/185 |
| 5,042,008 | 8/1991 | Iwasa et al. | 365/185 |
| 5,146,426 | 9/1992 | Mouwerjee et al. | 365/185 |
| 5,250,458 | 10/1993 | Tsukamoto et al. | 365/185 |
| 5,309,008 | 5/1994 | Watanabe | 365/301 |

OTHER PUBLICATIONS

S. Kimura et al., "A New Stacked Capacitor DRAM Cell Characterized by a Storage Capacitor on a Bit-line Structure", *IEDM*, 1988, pp. 596–599.

*Primary Examiner*—Eugene R. LaRoche
*Assistant Examiner*—Tan Nguyen
*Attorney, Agent, or Firm*—Sughrue, Mion, Zinn, Macpeak & Seas

[57] ABSTRACT

A semiconductor memory device including a plurality of memory cells of one-transistor and one-capacitor type is disclosed. Each of the memory cells includes a cell active region surrounded by a trench isolation region, a trench formed to cross the cell active region to thereby divide a surface portion of the cell active region into first and second parts, a word line formed in the trench in isolation form the cell active region by a gate insulating film, source and drain regions respectively formed in the first and second parts in contact with the trench, a first insulating film formed to cover the cell active region and the word line, a bit line formed in contact with a part of the drain region through a first contact hole provided in the first insulating film, a second insulating film formed to cover the bit line and the first insulating film, a storage electrode formed in contact with a part of the source region through a second contact hole provided in the first and second insulating films, a dielectric film formed on the storage electrode, and a cell plate electrode formed on the dielectric film.

5 Claims, 4 Drawing Sheets

SEMICONDUCTOR MEMORY DEVICE HAVING TRENCH IN WHICH WORD LINE IS BURIED

BACKGROUND OF THE INVENTION

The present invention relates to a semiconductor memory device and, more particularly, to a dynamic random access memory device (DRAM) having memory cells each composed of one transistor and one storage capacitor.

In accordance with increase in memory capacity of a DRAM, an area which is able to be allotted to each memory cell, i.e. a cell size, is required be made small. The capacitance value of the storage capacitor is lowered accordingly. The decrease in capacitance value of the storage capacitor means that the amount of charges stored in the capacitor is made small, so that the data stored in each memory cell is easily destroyed.

In order to enhance the storage capacitance with a small cell size, therefore, a new stacked-type memory cell was proposed in "International Electron Devices Meeting Technical Digest", 1988, pp. 596-599, as titled "A New Stacked DRAM Cell Characterized by a storage Capacitor on a Bit-lone Structure". Referring to FIG. 1, this proposed memory cell is characterized in that the storage electrode 100 of the capacitor is stacked over a bit line 103. A dielectric film 101 is formed on the storage electrode 100, and a cell plate electrode 102 is formed on the film 101. Since the storage electrode 100 is formed over the bit line 103, the surface area thereof is made enlarged, so that the relatively large storage capacitance is obtained. Incidentally, the reference numerals 104 and 105 denote a word line and a diffusion region such a source or a drain region, respectively.

In order to further enhance the storage capacitance, however, the storage electrode 100 has only to be made thick to thereby enlarge the side surface area thereof. As a result, the flatness of the device is deteriorated to make it difficult that wiring patterns for interconnecting respective circuit elements are made fine.

SUMMARY OF THE INVENTION

It is therefore an object of the present invention to provide a semiconductor memory device having an improved memory cell structure.

It is another object of the present invention to provide a semiconductor memory device including memory cells each having an enlarged storage capacitance with a small cell size and with maintaining the flatness of the device.

A semiconductor memory device according to the present invention is characterized in that each of the memory cells formed in a semiconductor substrate includes a cell active region surrounded by a trench isolation region selectively formed in the semiconductor substrate, a trench formed to cross the cell active region to thereby divide a surface portion of the cell active region into first and second parts, an insulating film filling the trench, a word line buried in the insulating film, source and drain regions formed respectively in the first and second parts in contact with the trench, a first insulating layer formed to cover the source and drain regions and the insulating film and having a first contact hole to expose a part of the drain region, a bit line formed in contact with the part of the drain region through the first contact hole, a second insulating layer formed to cover the bit line and the first insulating layer, a second contact hole selectively formed in the first and second insulating layers to expose a part of the source region, a storage electrode formed in contact with the part of the source region through the second contact hole, a dielectric film formed on the storage electrode, and a cell plate electrode formed on the dielectric film.

BRIEF DESCRIPTION OF THE DRAWINGS

The above and other objects, features and advantages of the present invention will be more apparent from the following description taken in conjunction with the accompanying drawings, wherein.

DETAILED DESCRIPTION OF THE PREFERRED EMBODIMENTS

Figure 1:
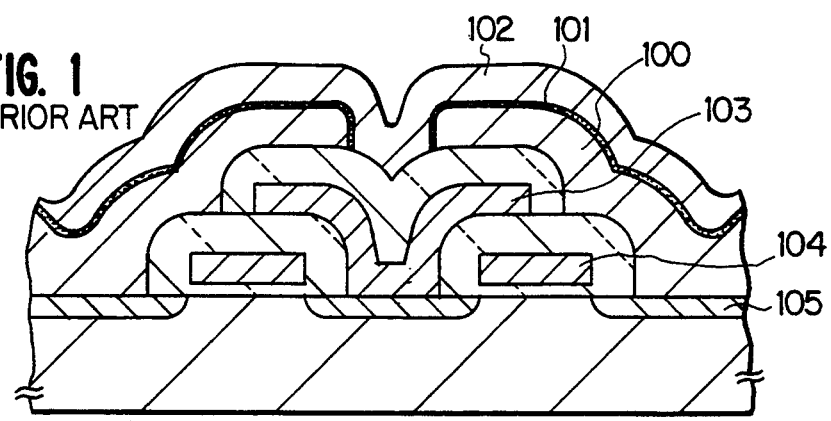
FIG. 1 is a cross sectional view illustrative of two memory cells according to the prior art.
Figure 2:
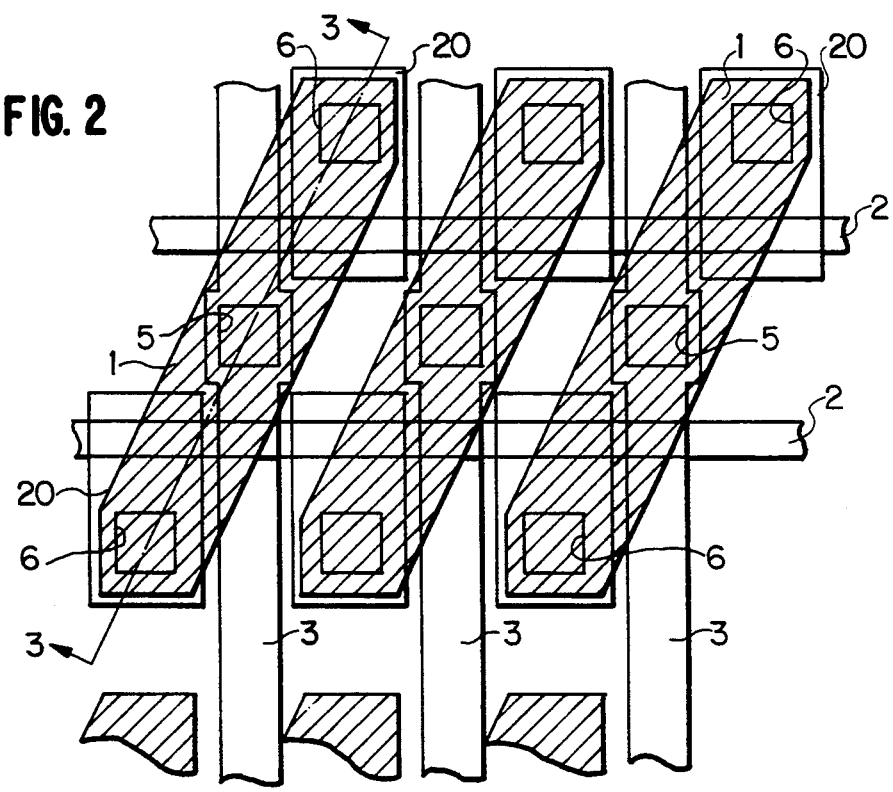
FIG. 2 is a plan view illustrative of a part of a memory cell array according to a first embodiment of the present invention.
Figure 3:
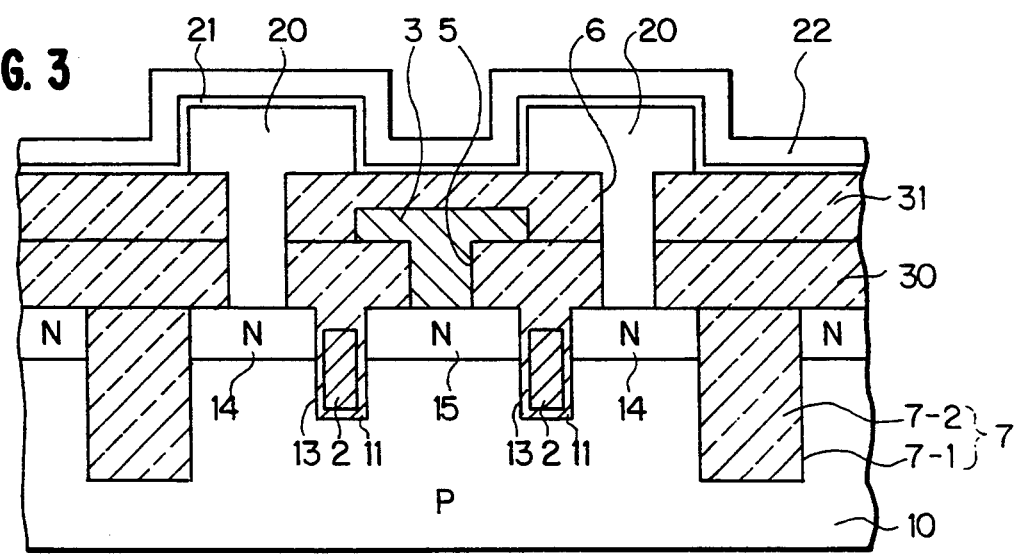
FIG. 3 is a cross sectional view along a line A-A' shown in FIG. 1.

Referring to FIGS. 2 and 3, a semiconductor memory device according to a first embodiment of the present invention includes a plurality of cell active regions 1 arranged in a plurality of rows and columns. In this embodiment, two memory cells are formed in one cell active region 1. Each of the cell active regions 1 are surrounded by a trench isolation region 7 and thus are isolated from one another. The trench isolation region 7 composed of a trench 7-1 selectively formed in a semiconductor substrate 10 made of silicon and an insulating material 7-2 such as a silicon dioxide film filling the trench 7-1. The substrate 10 is of a P-type in the present embodiment. If desired, an N-type substrate can be employed.

Since two memory cells are formed in one cell active region 1, two word lines 2 are formed to cross the cell active regions 1 arranged in one row. However, each of the word lines 2 is buried in the substrate 1 in isolation therefrom by a gate insulating film in accordance with the present invention. Specifically, a plurality of trenches 13 are selectively formed in each of the cell active regions 1 and the trench isolation region 7 to cross the associated one of the cell active regions 1. Each of the trenches 13 are formed with the depth smaller than the trench 7 to thereby divide the surface portion of each cell active region 1 into three parts. Source regions 14 of an N-type are formed in two parts of the surface portion of the cell active region 1, each of two parts being sandwiched the trenches 7 and 13, and a drain region 15 of the N-type is formed in the remaining part sandwiched between the trenches 13. Each trench 13 is covered with a gate insulating film 11, and the associated one of the word lines 2 made of polysilicon is formed on the gate insulating film 11. The top surface of each word line 1 is covered with a part of an insulating layer 30. Thus, each word line 2 is buried in the substrate 10 in isolating therefrom by the gate insulating film 11. Accordingly, the part of the substrate 10 along the trench 13 between the source and drain region 14 and 15 serves as a channel region of a memory cell transistor, and a part of the word line 2 serves as a gate electrode thereof.

The substrate 10 having the memory cell transistor thus formed is covered with the insulating layer 30 such as silicon oxide. A plurality of bit line contact holes 5 are provided in the insulating layer 30 to expose respective parts of the drain regions 15, and a plurality of bit lines 3 are formed on the insulating layer 30 and elongated in the direction of column. Each of the bit lines 3 is connected to the associated ones of the drain regions 15 through the bit line contact holes 5. An insulating layer 31 such as a silicon oxide film is further formed to cover the insulating layer 30 and each bit line 3.

A plurality of capacitor contact holes 6 are provided in the insulating layers 30 and 31 to expose respective parts of the source regions 14. Formed through the contact holes 6 on the exposed part of the source region 14 is a storage electrode 20 made of polysilicon. This storage electrode 20 is elongated over the insulating layer 31 to enlarge the surface area thereof. A dielectric film 21 is formed over the entire surface of each storage electrode 20 and the insulating layer 31, and a cell plate electrode 22 made of polysilicon is formed on the dielectric film 21. Thus, a memory capacitor is formed to be connected to the b cell transistor.

As described above, each word line 2 is buried in the substrate 10. The step over the surface of the substrate 10 is decreased accordingly. Therefore, even when the storage electrode 20 is made thick to further enlarge the surface area thereof, the surface flatness of the device is maintained.

Figure 4A:
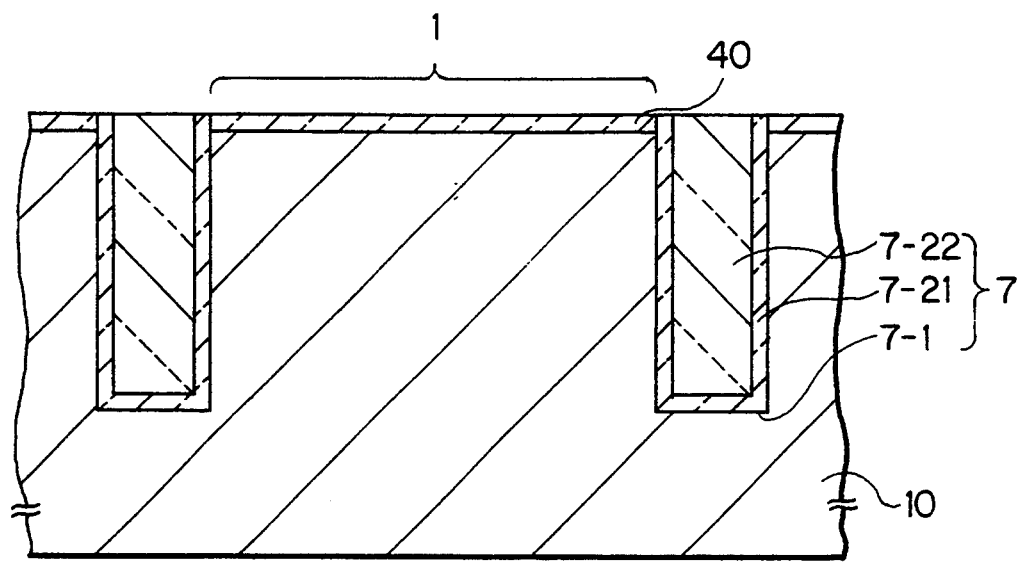
FIGS. 4A-4D are cross sectional views indicative of manufacturing steps of the device shown in FIGS. 2 and 3.

The device illustrated in FIGS. 2 and 3 is produced in accordance with the steps shown FIGS. 4A to 4D. Specifically, as shown in FIG. 4A, the P-type silicon substrate 10 is prepared and covered with s silicon dioxide film 40 and a mask layer (not shown). The dry-etching is then carried out to form the trench 7. The cell active regions 1 are thereby defied by the trench 7. The trench 7 is then covered by a silicon oxide film 7-21 and further filled with an insulating material 7-22 such as a silicon oxide film, a PSG film or a BPSG film. The trench isolation region 7 is thus formed.

Figure 4B:
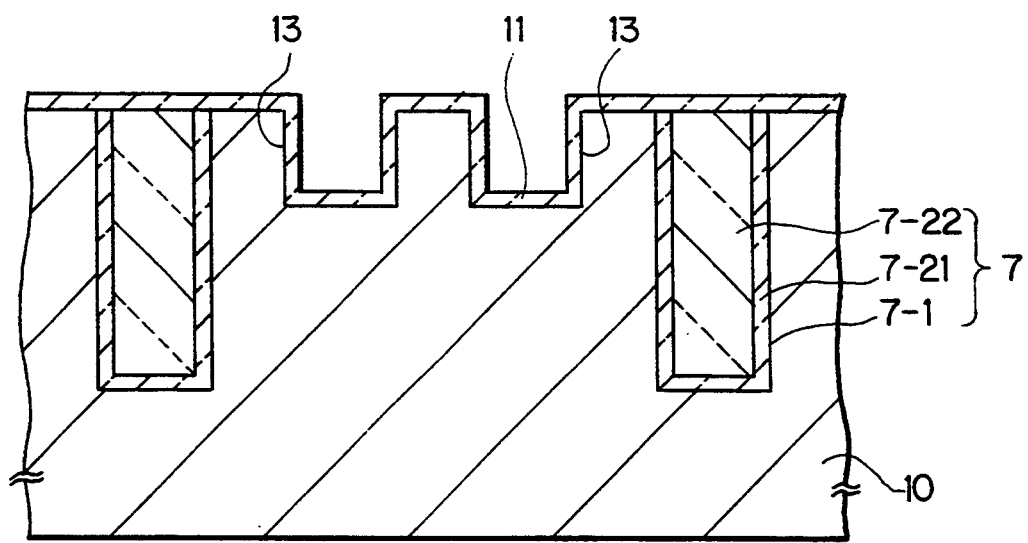

As shown in FIG. 4B, the oxide film 40 is removed and a new mask layer (not shown) is formed on the substrate 10. The dry-etching is then performed to remove the respective parts of each cell active region 1 and the trench isolation region 7 to thereby form the trenches 13. The heat treatment is then performed to form the gate oxide film 11 on the surface of each trench 13.

Figure 4C:
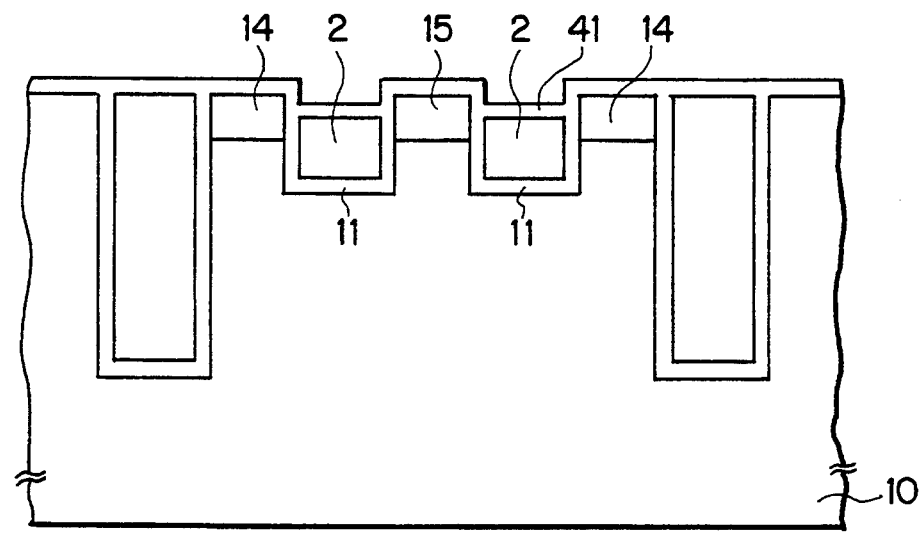

As shown in FIG. 4C, a polysilicon film is deposited over the entire surface and a selective-etching process is then carried out to form the,polysilicon word lines 2. After covering the top surface of each word line 2 with a silicon oxide film 41, impurity ions indicative of the N-type such as arsenic or phosphorus are implanted into the parts of the substrate 10 and the word lines 2, followed by the heat treatment to activate the ion-implanted impurities. The source and drain regions 14 and 15 are thereby formed and each word line 2 is lowered in the resistance thereof.

Figure 4D:
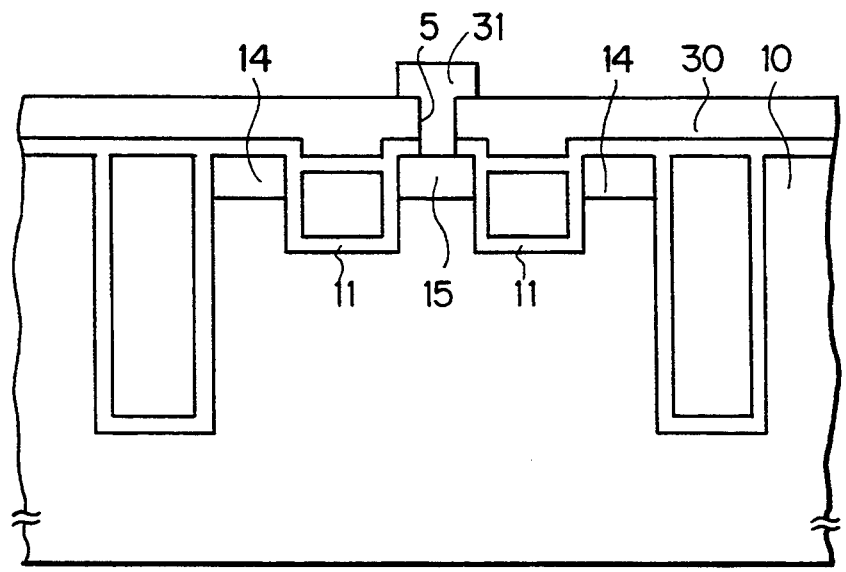

As shown in FIG. 4D, the insulating layer 30 such a silicon oxide film is formed on the entire surface, and the bit line contact holes 5 are selectively formed in the insulating layer 31. The bit lines 3 made of silicide of silicon and a refractory metal is formed in contact with the associated ones of the drain regions 15 through the bit line contact holes 5.

Thereafter, as shown in FIG. 3, the insulating layer 31 is deposited over the entire surface and the capacitor contact holes 5 are formed to expose the respective parts of the source regions 14. The cell capacitors are thereafter formed as mentioned above.

Figure 5:
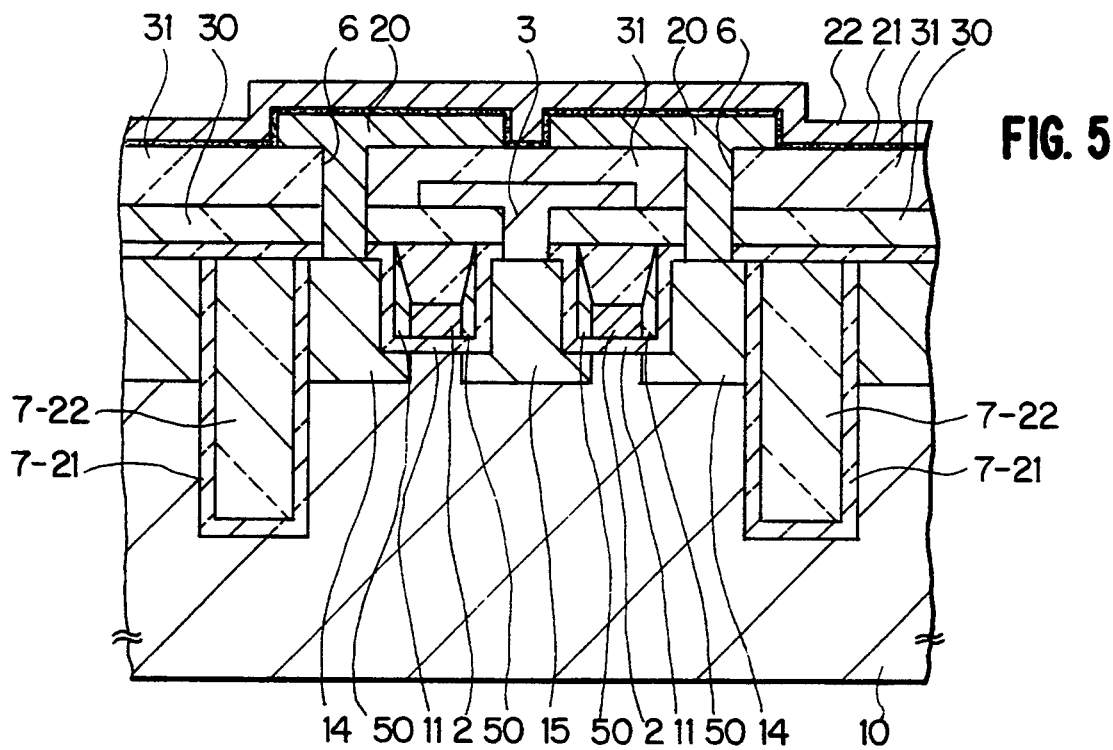
FIG. 5 is a cross sectional view illustrative of a second embodiment of the present invention.

Referring to FIG. 5, there is shown a device according to a second embodiment of the present invention, in which the same constituents as those shown in FIGS. 2–4 are denoted by the same reference numerals to omit the further description thereof. In this embodiment, a silicon oxide film 50 is formed along each side surface of the respective word lines 2. This oxide film 2 prevents the concentration of the electric field applied to the respective corner portions of each trench 13, so that the gate oxide film 11 is protected from the destruction. Further in this embodiment, each of the source and drain regions 14 and 15 is formed deeper to define the channel region of the cell transistor at the bottom portion of the trench 13.

Figure 6:
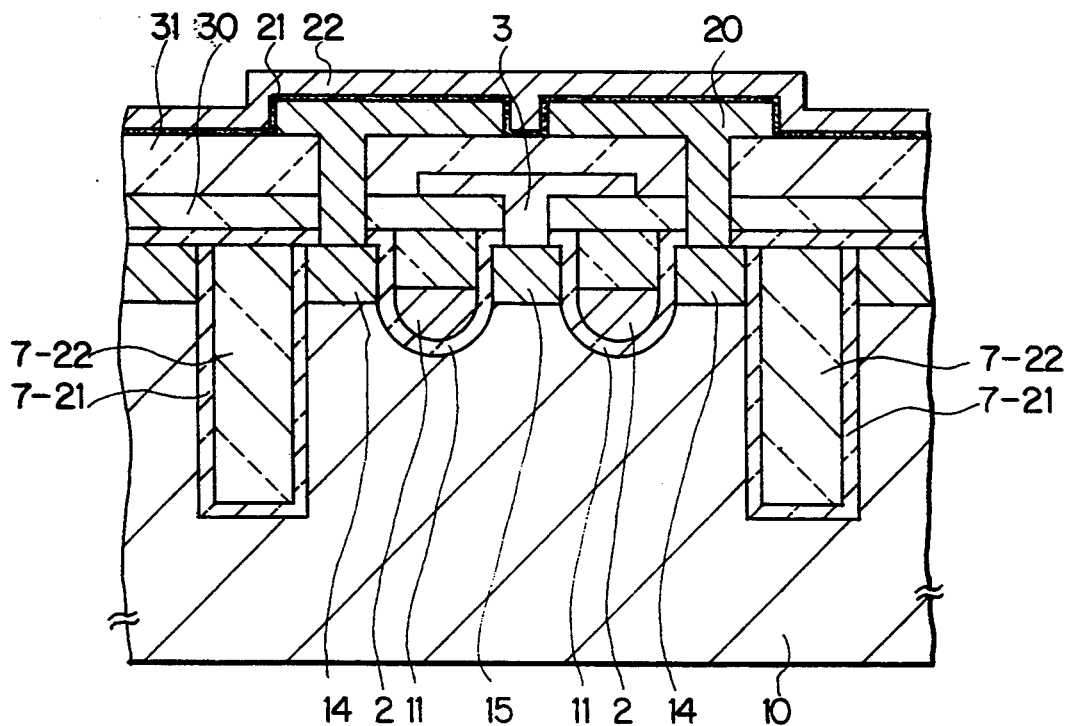
FIG. 6 is a cross sectional view illustrative of a third embodiment of the present invention.

Turning now to FIG. 6, the memory cell shown therein has the trenches 13 each formed with a rounded bottom in accordance with a third embodiment of the present invention. The other constituents are the same as those shown in FIGS. 2–4. Accordingly, the gate oxide film 11 is protected from the destruction without forming the oxide film 50 shown in FIG. 5.

It is apparent that the present invention is not limited to the above embodiments, but may be modified and changed without departing from the scope and spirit of the invention. For example, the respective conductivity types are changed to other types, and the other suitable impurities can be employed to form the source and drain regions. Moreover, the material for the respective insulating films or layers may replaced with other suitable ones. Furthermore, the source and drain regions may be formed before forming the word lines.

What is claimed is:

1. A semiconductor memory device having a plurality of memory cells formed in a semiconductor substrate of one conductivity type, each of said memory cells comprising a cell active region surrounded by a trench isolation region selectively formed in said semiconductor substrate, a trench formed to cross said cell active region to thereby divide a surface portion of said cell active region into first and second parts, a word line formed in said trench in isolation from said cell active region by a gate insulating film, first and second regions of an opposite conductivity type respectively formed in said first and second parts of said surface portion of said cell active region in contact with said trench, a first insulating layer formed to cover said word line and said cell active region, a first contact hole selectively formed in said first insulating layer to expose a part of said first region, a bit line formed in contact with said part of said first region through said first contact hole, a second insulating layer formed to cover said bit line and said first insulating layer, a second contact hole selectively formed in said first and second insulating layers to expose a part of said second region, a storage electrode formed in contact with said part of said second region, a dielectric film formed on said storage electrode, and a cell plate electrode formed on said dielectric film.

2. The device as claimed in claim 1, wherein said trench has a bottom portion and a side portion, said gate insulating film having a first portion formed on said bottom portion of said trench with a first thickness and a second portion formed on said side portion of said trench with a second thickness that is lager than said first thickness.

3. The device as claimed in claim 1, wherein said trench has a bottom portion, each of said first and second regions terminating at said bottom portion of said trench to define a channel region along a part of said bottom portion of said trench.

4. The device as claimed in claim 1, wherein said trench has a rounded bottom portion to be free from formation of an edge corner.

5. A semiconductor memory device comprising a semiconductor substrate of one conductivity type, a first trench formed in said semiconductor substrate in a mesh shape to define a plurality of cell active regions in said semiconductor substrate, said cell active regions being thereby arranged in a plurality of rows and columns, a first insulating film filling said first trench, a plurality of second trenches each provided correspondingly to each of said rows, each of said second trenches thereby crossing associated ones of said cell active regions arranged in the same row to divide a surface portion of each of the associated ones of said cell active regions into first and second parts, a plurality of word lines each formed in each of said second trenches in isolation from each cell active region by a gate insulating film, a plurality first regions of an opposite conductivity type each formed in an associated one of said first parts of said surface portions of said cell active regions, a plurality of second regions of said opposite conductivity type each formed in an associated one of said second parts of said surface portion of said cell active regions, a second insulating film formed to cover said cell active regions and said first insulating film, a plurality of first contact holes formed in said second insulating film to expose respective parts of said first regions, a plurality of bit lines each provided correspondingly to each of said columns, each of said bit lines being thereby in contact through said first contact holes with each of said parts of said first regions arranged in the same column, a third insulating film formed to cover said second insulating film and said bit lines, a plurality of second contact holes formed in said second and third insulating films to expose respective parts of said second regions, a plurality of storage electrodes each formed in contact with an associated one of said parts of said second regions, a dielectric film formed to cover each of said storage electrodes and said third insulating film, and a cell plate electrode formed on said dielectric film.

* * * * *